(12) United States Patent
Sano

(10) Patent No.: US 8,995,122 B2
(45) Date of Patent: Mar. 31, 2015

(54) ELECTRONIC DEVICE AND ELECTRONIC-DEVICE HOUSING

(75) Inventor: Tetsuhiro Sano, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 136 days.

(21) Appl. No.: 13/393,607

(22) PCT Filed: Apr. 7, 2011

(86) PCT No.: PCT/JP2011/002061
§ 371 (c)(1),
(2), (4) Date: Mar. 1, 2012

(87) PCT Pub. No.: WO2011/129075
PCT Pub. Date: Oct. 20, 2011

(65) Prior Publication Data
US 2012/0162916 A1    Jun. 28, 2012

(30) Foreign Application Priority Data
Apr. 12, 2010    (JP) ................................ 2010-091066

(51) Int. Cl.
*H05K 7/20* (2006.01)
*H05K 5/02* (2006.01)

(52) U.S. Cl.
CPC .......... *H05K 7/20136* (2013.01); *H05K 5/0234* (2013.01)
USPC ...... 361/679.46; 361/676; 361/688; 361/831; 454/184

(58) Field of Classification Search
USPC ............... 361/679.46–679.54, 688–722, 752, 361/756, 831
See application file for complete search history.

(56) References Cited

U.S. PATENT DOCUMENTS

| | | | |
|---|---|---|---|
| 5,359,349 A * | 10/1994 | Jambor et al. | 345/168 |
| 6,104,451 A * | 8/2000 | Matsuoka et al. | 349/58 |
| 6,512,671 B1 | 1/2003 | Okano et al. | |
| 6,678,157 B1 * | 1/2004 | Bestwick | 361/695 |

(Continued)

FOREIGN PATENT DOCUMENTS

| | | |
|---|---|---|
| JP | 5-048281 | 2/1993 |
| JP | 9-237992 | 9/1997 |

(Continued)

OTHER PUBLICATIONS

International Search Report issued Jun. 14, 2011 in International (PCT) Application No. PCT/JP2011/002061.

(Continued)

*Primary Examiner* — Courtney Smith
(74) *Attorney, Agent, or Firm* — Wenderoth, Lind & Ponack, L.L.P.

(57) ABSTRACT

An electronic-device housing stores an electronic circuit and a cooling fan. The electronic-device housing includes a first surface having at least one opening to release heat outside. At least one projected portion projects toward an outside of the electronic-device housing, and when the electronic-device housing is installed on an installation surface so that the first surface is opposed to the installation surface and the projected portion comes into contact with the installation surface, a rotation moment acting on a gravity center of the electronic-device housing acts in a direction where the rotation moment causes the first surface to move away from the installation surface.

7 Claims, 11 Drawing Sheets

(56) References Cited

U.S. PATENT DOCUMENTS

| | | | |
|---|---|---|---|
| 8,243,434 B2* | 8/2012 | Xue | 361/679.33 |
| 8,582,296 B2* | 11/2013 | Huang | 361/695 |
| 2001/0048584 A1* | 12/2001 | Rosen | 361/681 |
| 2002/0012228 A1* | 1/2002 | Ozaki et al. | 361/687 |
| 2003/0090864 A1* | 5/2003 | Kuo | 361/683 |
| 2011/0075352 A1* | 3/2011 | Tye et al. | 361/679.46 |

FOREIGN PATENT DOCUMENTS

| | | |
|---|---|---|
| JP | 10-233590 | 9/1998 |
| JP | 2001-118368 | 4/2001 |
| JP | 2001-326486 | 11/2001 |
| JP | 2002-280777 | 9/2002 |
| JP | 2004-349560 | 12/2004 |
| JP | 2005-222584 | 8/2005 |

OTHER PUBLICATIONS

English translation of International Preliminary Report on Patentability issued Nov. 6, 2012 in International (PCT) Application No. PCT/JP2011/002061.

* cited by examiner

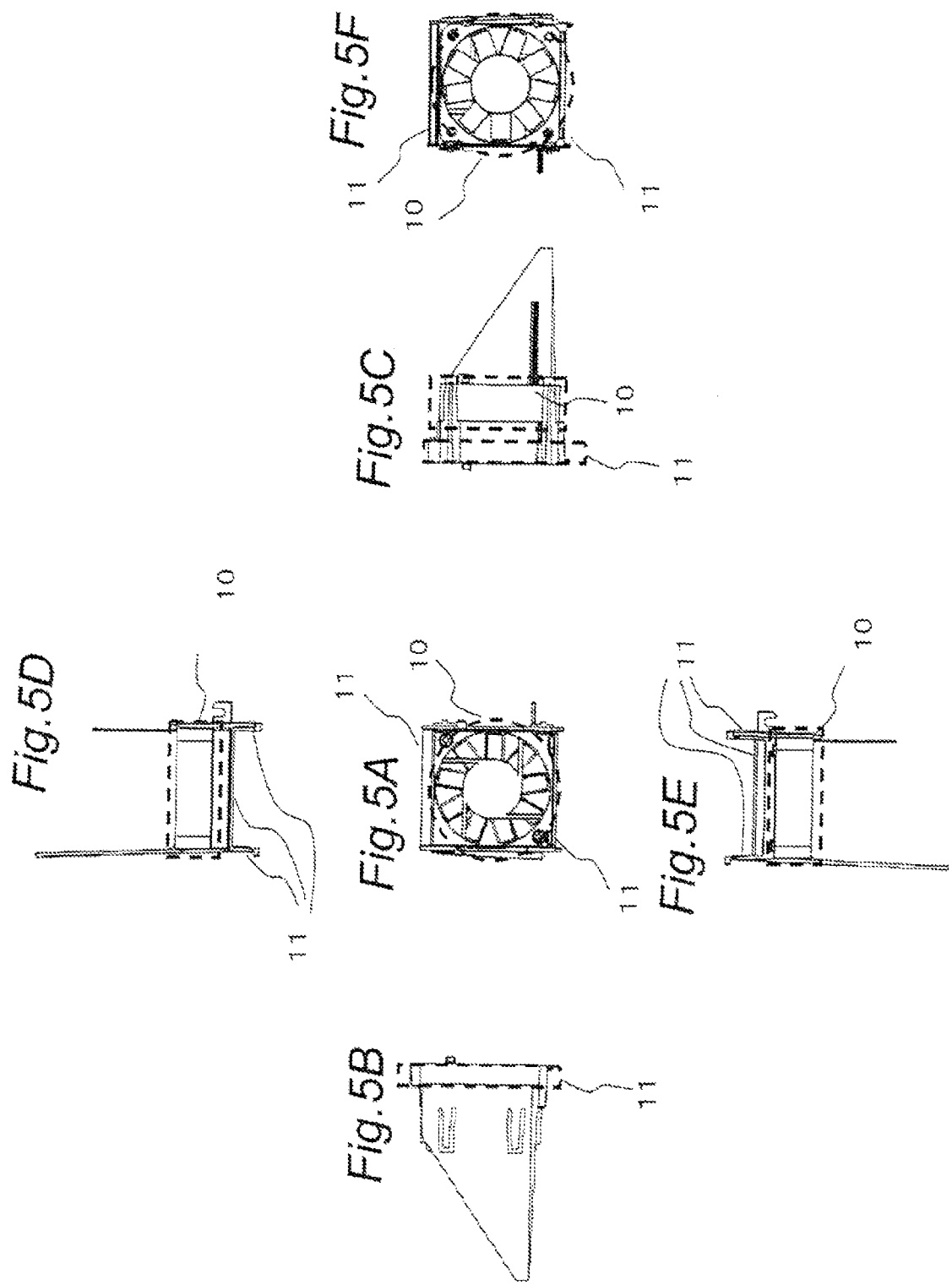

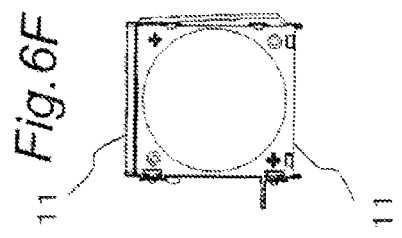
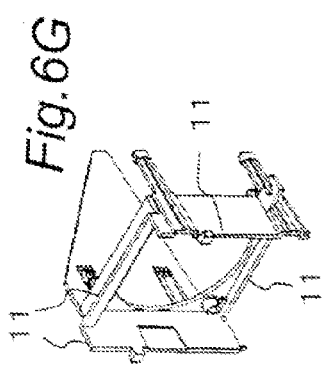
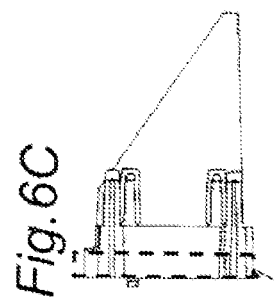
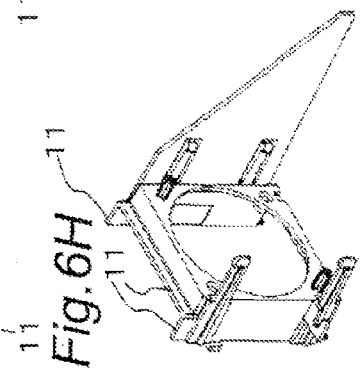
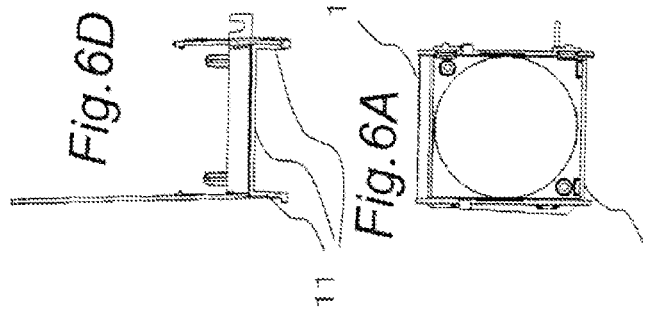
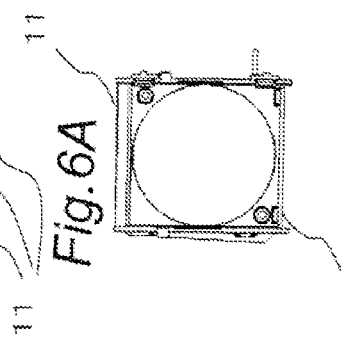
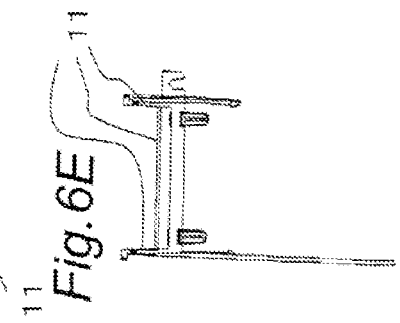
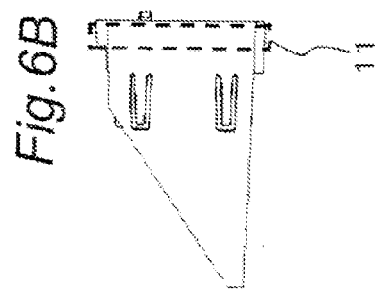

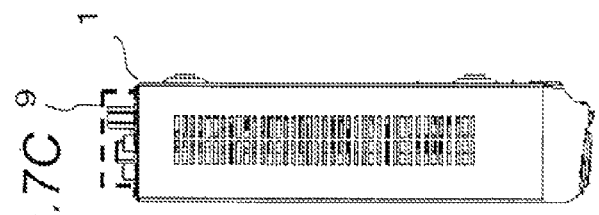
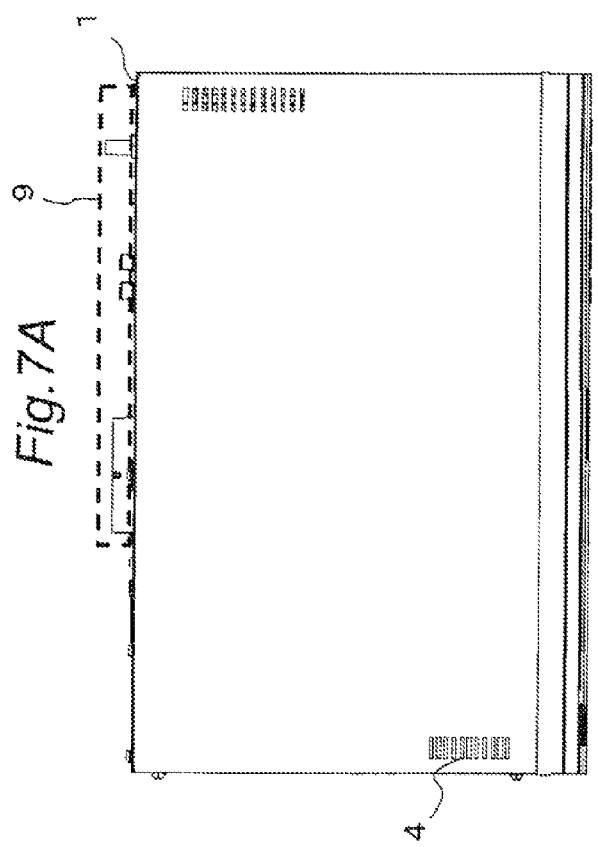
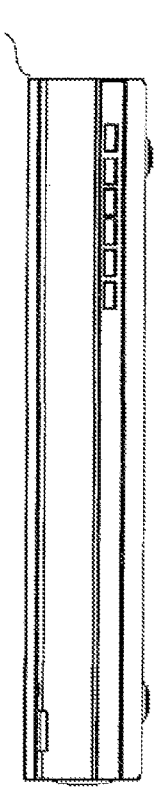
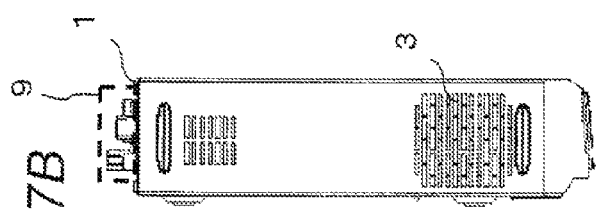

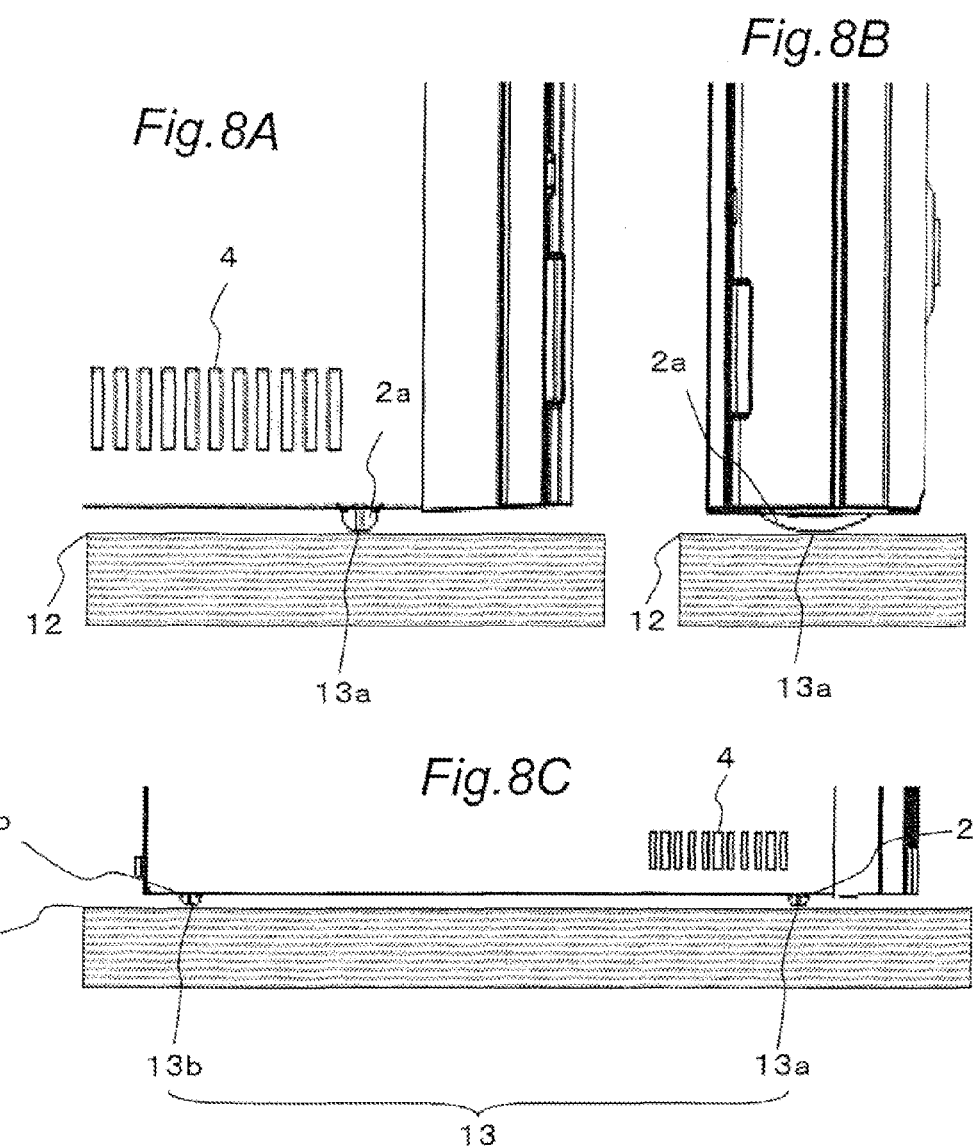

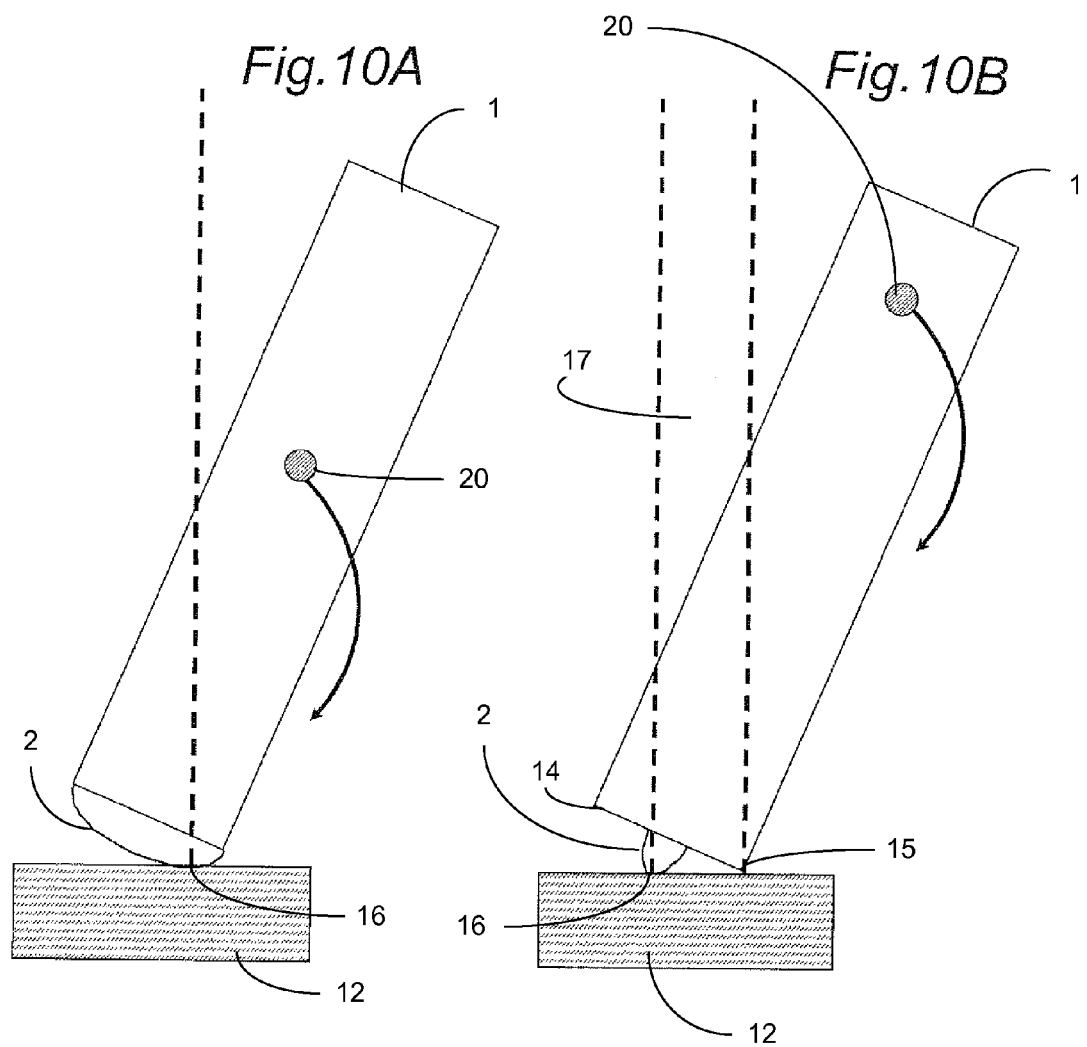

ELECTRONIC DEVICE AND ELECTRONIC-DEVICE HOUSING

BACKGROUND

1. Technical Field

The present application claims the priority of Japanese Patent Application No. 2010-91066 filed in Japan on Apr. 12, 2010, the contents of which are hereby incorporated by reference.

The present invention relates to an electronic device and an electronic-device housing, and more particularly to a small-size electronic-device housing that realizes stable cooling.

2. Background Art

In recent years, as a result of an increased integration degree of an electronic circuit, downsizing of an electronic device has been advanced. When the electronic device is downsized, a ratio of space in a housing is reduced, which causes a problem with how to perform cooling inside the housing. Generally, a cooling fan is used for the cooling inside the housing. Specifically, a vent hole is provided in a back surface, a side surface, an upper surface, or the like of the housing to install the cooling fan in the vicinity of the vent hole. This allows suction or exhaust through the vent hole to be performed, so that outer air circulates inside the housing to thereby cool the housing.

It is important not to block the vent hole of the housing in the cooling using the cooling fan. When the housing is placed with the vent hole at the bottom, or the housing is brought close to a side wall in an installation site such that the vent hole in the side surface of the housing is blocked, the suction or the exhaust is not sufficiently performed. When the suction or the exhaust is not sufficiently performed, hot air stays inside the housing, thereby causing poor cooling of the electronic device.

In Japanese Patent Laid-open Publication No. 2002-280777, there is disclosed a housing provided with legs in side surfaces, an upper surface, and a bottom surface of the housing each having a vent hole. Thereby, the legs make clearances between the vent holes and the wall surface, which prevents each of the vent holes from being blocked, in whichever direction the housing is placed.

SUMMARY OF THE INVENTION

However, when the clearance is made between each of the vent holes and the side wall as in the conventional technique, an installation area of the entire electronic device increases because of spread of the legs provided in the respective surfaces of the housing of the electronic device.

Particularly, in the electronic device having the vent holes in the side surfaces of the housing, when the electronic device is installed with the side surface having the vent hole at the bottom, the leg having a width beyond a height of the electronic device (a width in installing the electronic device with the side surface at the bottom) needs to be provided in the housing in terms of uprightness stability of the electronic device. Thus, even though the electronic-device housing is designed so as to be thinner, thereby having higher applicability, the design of providing the legs in the side surfaces of the housing and the like disadvantageously makes the electronic device thicker and poorer in applicability.

That is, in the conventional technique, there is a problem that even if the downsizing of the electronic device is attempted, the legs attached for assurance of cooling performance inhibit the downsizing.

The present invention is devised in view of the above-described situation, and an object thereof is to provide an electronic-device housing that prevents a vent hole of the electronic-device housing from being blocked while promoting downsizing of an electronic device.

In order to solve the conventional problem, an electronic-device housing according to the present invention is an electronic-device housing capable of storing therein an electronic circuit and a cooling fan, the electronic-device housing including a first surface having at least one opening to release heat outside, and at least one projected portion projected toward an outside of the electronic-device housing, wherein when the electronic-device housing is installed on an installation surface so that the first surface is opposed to the installation surface, and the projected portion comes into contact with the installation surface, a rotation moment acting on a gravity center of the electronic-device housing acts in a direction where the rotation moment causes the first surface to move away from the installation surface.

Moreover, an electronic device of the present invention is an electronic device including:

an electronic circuit;

a cooling fan; and an electronic-device housing capable of storing therein the electronic circuit and the cooling fan, wherein the electronic-device housing includes a first surface having at least one opening to release heat outside, and at least one projected portion projected toward an outside of the electronic-device housing, and when the electronic device is installed on an installation surface so that the first surface is opposed to the installation surface, and the projected portion comes into contact with the installation surface, a rotation moment acting on a gravity center of the electronic device acts in a direction where the rotation moment causes the first surface to move away from the installation surface.

According to the electronic-device housing of the present invention, even if the electronic-device housing is installed such that the opening for ventilation provided in the first surface (side surface) of the electronic-device housing is at the bottom, the projected portion provided in the first surface (side surface) causes a self-sustaining balance of the electronic-device housing to be lost, thereby inhibiting the installation with the first surface at the bottom, and thus, the opening can be prevented from being blocked.

Moreover, when the electronic device is installed so that the opening for ventilation of the first surface (side surface) is blocked, the projected portion provided in the first surface (side surface) causes the self-sustaining balance of the electronic device to be lost, thereby inhibiting the installation with the first surface at the bottom, and thus the opening can be prevented from being blocked.

BRIEF DESCRIPTION OF THE DRAWINGS

The present invention will become readily understood from the following description of preferred embodiments thereof made with reference to the accompanying drawings, in which like parts are designated by like reference numeral and in which:

FIG. 5A is a front view of a cooling fan unit in the set-top box according to the one embodiment of the present invention;

FIG. 5B is a left side view of the cooling fan unit in the set-top box according to the one embodiment of the present invention;

FIG. 5C is a right side view of the cooling fan unit in the set-top box according to the one embodiment of the present invention;

FIG. 5D is a top view of the cooling fan unit in the set-top box according to the one embodiment of the present invention;

FIG. 5E is a bottom view of the cooling fan unit in the set-top box according to the one embodiment of the present invention;

FIG. 5F is a back view of the cooling fan unit in the set-top box according to the one embodiment of the present invention;

FIG. 6A is a front view of a fan holding portion in the set-top box according to the one embodiment of the present invention;

FIG. 6B is a left side view of the fan holding portion in the set-top box according to the one embodiment of the present invention;

FIG. 6C is a right side view of the fan holding portion in the set-top box according to the one embodiment of the present invention;

FIG. 6D is a top view of the fan holding portion in the set-top box according to the one embodiment of the present invention;

FIG. 6E is a bottom view of the fan holding portion in the set-top box according to the one embodiment of the present invention;

FIG. 6F is a back view of the fan holding portion in the set-top box according to the one embodiment of the present invention;

FIG. 6G is a perspective view from a right front side of the fan holding portion in the set-top box according to the one embodiment of the present invention;

FIG. 6H is a perspective view from a left rear side of the fan holding portion in the set-top box according to the one embodiment of the present invention;

FIG. 7A is a top view of the set-top box according to the one embodiment of the present invention;

FIG. 7B is a left side view of the set-top box according to the one embodiment of the present invention;

FIG. 7C is a right side view of the set-top box according to the one embodiment of the present invention.

FIG. 7D is a front view of the set-top box according to the one embodiment of the present invention;

FIG. 8A is a partially enlarged view of the vicinity of an installation surface when viewed from an upper surface direction in installing the set-top box according to the one embodiment of the present invention with the left side surface at the bottom;

FIG. 8B is a partially enlarged view of the vicinity of the installation surface when viewed from a front surface direction in installing the set-top box according to the one embodiment of the present invention with the left side surface at the bottom;

FIG. 8C is a partial view of a lower half of the vicinity of the installation surface when viewed from the upper surface direction in installing the set-top box according to the one embodiment of the present invention with the left side surface at the bottom;

FIG. 10A is a schematic view showing a motion when the set-top box comes into contact with the installation surface only at apexes of the projected portions in installing the set-top box with the side surface having the projected portions at the bottom;

FIG. 10B is a schematic view showing a motion when the set-top box comes into contact with the installation surface at the apexes of the projected portions and one side of the side surface in installing the set-top box with the side surface having the projected portions at the bottom.

DETAILED DESCRIPTION OF THE INVENTION

Figure 1:
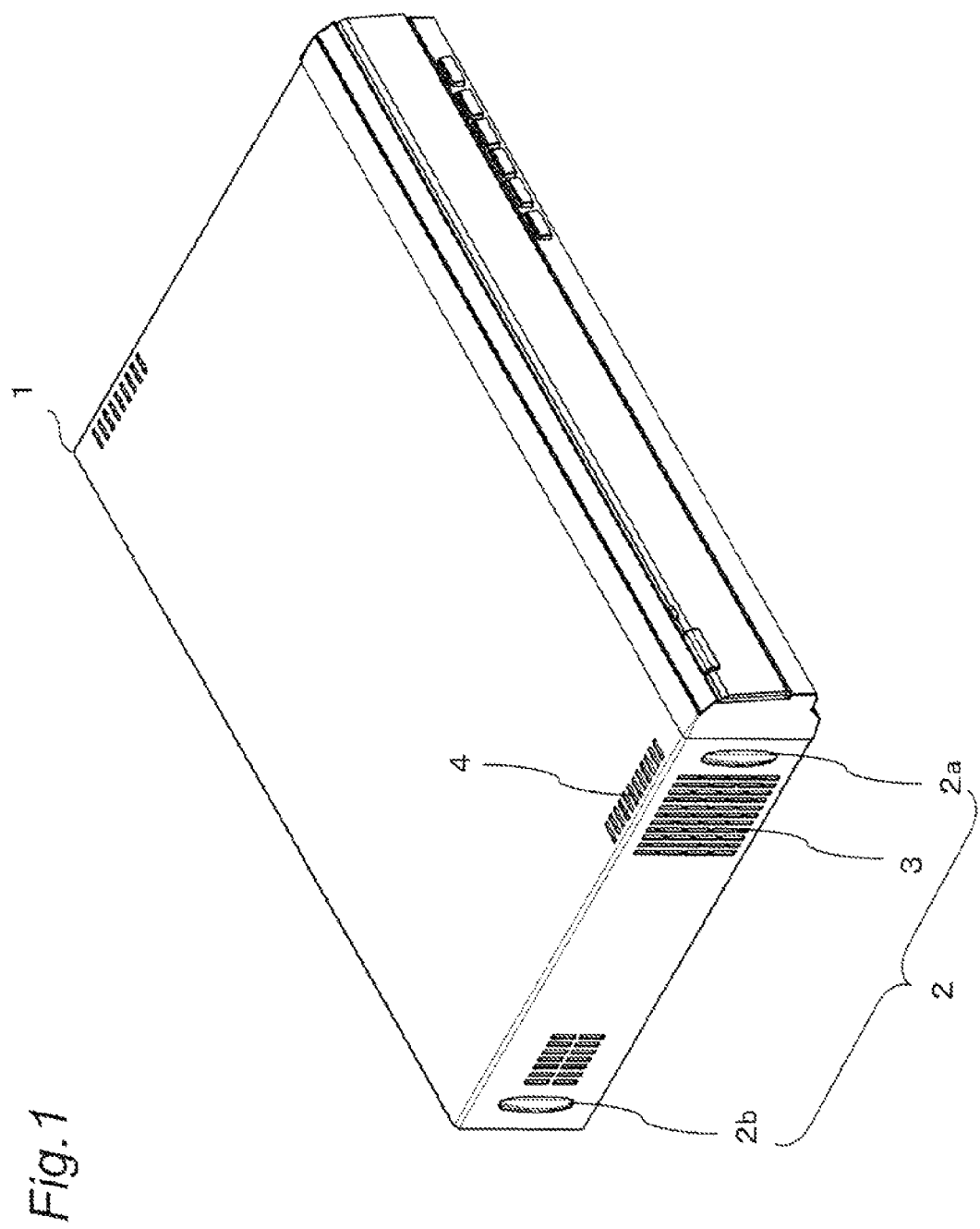
FIG. 1 is a perspective view from a left front side of a set-top box according to one embodiment of the present invention.

Hereinafter, several aspects of an electronic-device housing according to the present invention will be described.

An electronic-device housing of a first aspect according to the present invention is an electronic-device housing capable of storing therein an electronic circuit and a cooling fan, the electronic-device housing including a first surface having at least one opening to release heat outside, and at least one projected portion projected toward an outside of the electronic-device housing, wherein when the electronic-device housing is installed on an installation surface so that the first surface is opposed to the installation surface, and the projected portion comes into contact with the installation surface, a rotation moment acting on a gravity center of the electronic-device housing acts in a direction where the rotation moment causes the first surface to move away from the installation surface.

Moreover, in the first aspect, it is preferable that when the electronic-device housing is installed on the installation surface so that the first surface is opposed to the installation surface, and the projected portion comes into contact with the installation surface, the gravity center of the electronic-device housing exists outside a virtual solid formed vertically above a surface formed by connecting the projected portion in contact with the installation surface, and each end portion of the first surface in contact with the installation surface.

Further, as an electronic-device housing of a second aspect, in the first aspect, the electronic-device housing may have a rectangular parallelepiped shape having a pair of side surfaces, a bottom surface, an upper surface, a front surface, and a back surface. In this case, the first surface may correspond to one side surface of the pair of side surfaces, and at least one length of: a height of the electronic-device housing corresponding to a length between the upper surface and the bottom surface, and a depth of the electronic-device housing corresponding to a length between the front surface and the back surface may be not more than a width of the electronic-device housing corresponding to a length between the pair of side surfaces.

Furthermore, in the second aspect, the cooling fan may be arranged so as to be opposed to the one side surface inside the electronic-device housing. Moreover, the one side surface may have a first opening for ventilation in an area opposed to the cooling fan. Furthermore, when the electronic-device housing is installed with the one side surface at the bottom, an apex of the projected portion may come into contact with the installation surface at a point.

In the first aspect, the projected portion may include a plurality of projected portions, and the plurality of projected portions may be arranged in a line.

Further, in the first aspect, the electronic-device housing cannot stand on its own in installing the electronic-device housing with the first surface at the bottom.

Furthermore, in the first aspect, the projected portion may have a curved surface.

In the second aspect, when the electronic-device housing is installed with the one surface at the bottom, an apex of the projected portion may be located on the upper surface side with respect to a gravity center axis vertically passing the gravity center of the electronic-device housing.

Further, in the second aspect, an upper surface and a bottom surface of the electronic-device housing may include a second opening and a third opening for ventilation, respectively. The electronic-device housing may further include a duct connecting a ventilation path between the cooling fan, and the opening, the second opening, and the third opening.

In the above-described case, the cooling fan may be arranged inside the electronic-device housing so as to be parallel to, spaced at a predetermined distance from, and opposed to one side surface of the electronic-device housing. Further, the second opening and the third opening may be provided in the predetermined distance from the one side surface of the electronic-device housing.

An electronic device of a third aspect according to the present invention includes the electronic-device housing of the first aspect or the second aspect,
an electronic circuit stored inside the electronic-device housing, and
a cooling fan stored inside the electronic-device housing.

An electronic device of a fourth aspect according to the present invention is an electronic device including an electronic circuit,
a cooling fan, and
an electronic-device housing capable of storing therein the electronic circuit and the cooling fan, wherein
the electronic-device housing has a first surface having at least one opening to release heat outside, and at least one projected portion projected toward an outside of the electronic-device housing, and
when the electronic device is installed on an installation surface so that the first surface is opposed to the installation surface, and the projected portion comes into contact with the installation surface, a rotation moment acting on a gravity center of the electronic device acts in a direction where the rotation moment the first surface to move away from the installation surface.

Moreover, as a fifth aspect, in the fourth aspect, an upper surface and a bottom surface of the electronic-device housing may include a second opening and a third opening for ventilation, respectively. Moreover, the electronic-device housing may include a duct connecting a ventilation path between the cooling fan, and the opening, the second opening, and the third opening.

In the fifth aspect, the cooling fan may be arranged inside the electronic-device housing so as to be parallel to, spaced at a predetermined distance from, and opposed to one side surface of the electronic-device housing. Moreover, the second opening and the third opening may be provided in the predetermined distance from the one side surface of the electronic-device housing.

Hereinafter, the electronic device and the electronic-device housing according to one embodiment of the present invention will be described with reference to the accompanying drawings. In the drawings, the same reference numerals are given to the substantially same members.

In the present embodiment, an embodiment in which the electronic-device housing according to the present invention is applied to a set-top box will be described as one embodiment of the present invention.

<Configuration of Housing>

Hereinafter, referring to FIGS. 1 to 7, a configuration of the electronic-device housing according to the present embodiment will be described.

FIG. 1 is a perspective view from a left front side of the set-top box according to the one embodiment of the present invention. A set-top box 1 is a housing having a structure of a substantially rectangular parallelepiped shape with a pair of side surfaces, a bottom surface, an upper surface, a front surface, and a back surface. As a shape of the housing, the rectangular parallelepiped shape is one example, and the present invention is not limited thereto. For example, the housing may have an inclined surface having a trapezoidal shape or the like. Alternatively, the housing may have a curved surface. Moreover, in the left side surface of the set-top box 1, there are provided projected portions 2a, 2b having the substantially same shape as each other, and a first opening 3 for ventilation toward an outside of the housing. Also, in the upper surface of the set-top box 1, a second opening 4 for ventilation may be provided on a left front side. This second opening 4 is not a requisite component of the set-top box according to the present invention. Providing the second opening 4 in the upper surface enables the ventilation by the second opening 4, even when the set-top box 1 is installed with the left side surface at the bottom.

Figure 2:
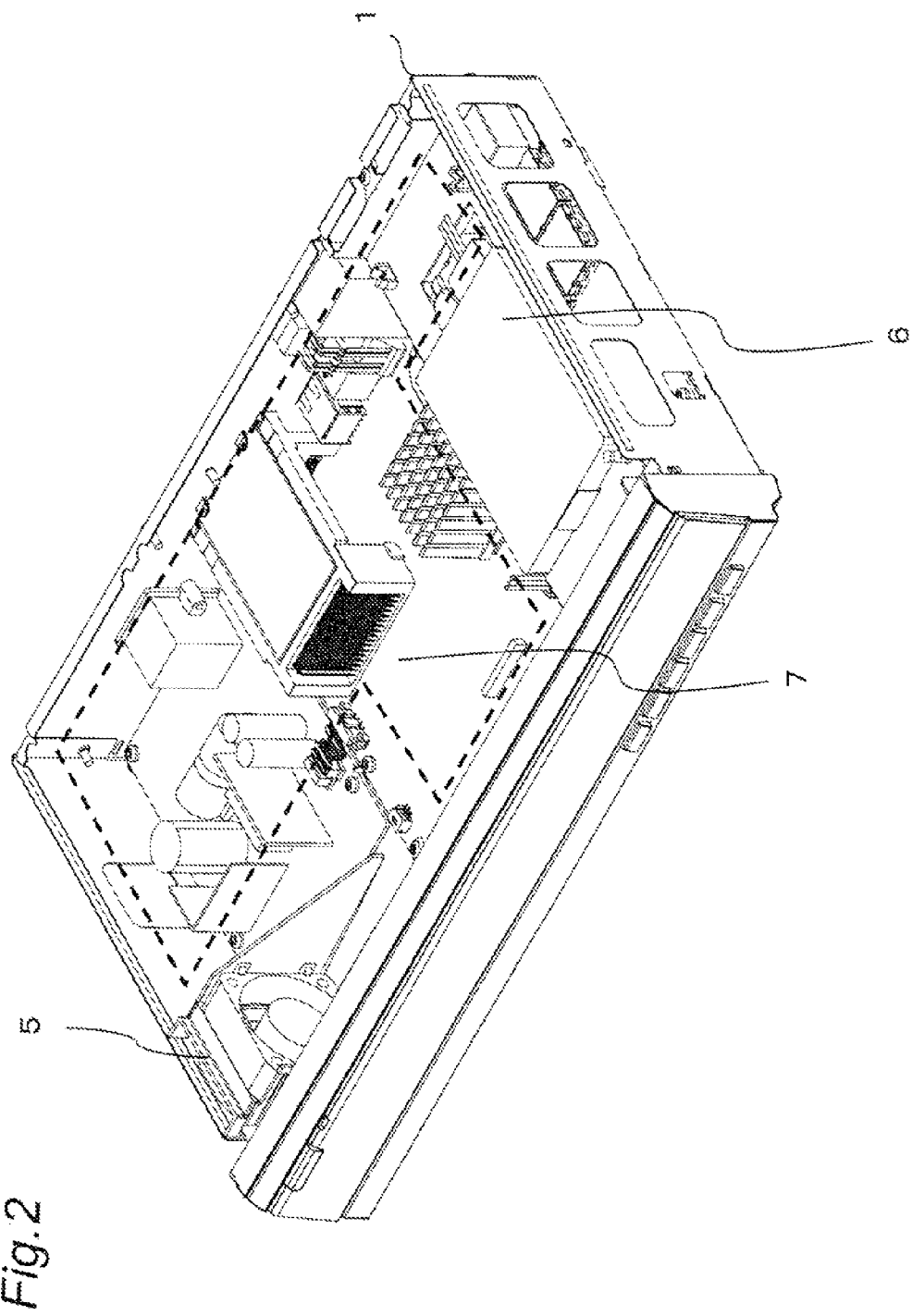
FIG. 2 is a perspective view from a right front side, showing an internal structure of the set-top box according to the one embodiment of the present invention.

FIG. 2 is a perspective view from a right front side, showing an internal structure of the set-top box according to the one embodiment of the present invention. Inside the housing of the set-top box 1, a cooling fan unit 5 is arranged so as to be parallel to, spaced at a predetermined distance from, and opposed to a left side surface inside the housing. Moreover, in a right inside of the housing, for example, a hard disk drive 6 is included. The hard disk drive 6 is one example, and is not requisite for the set-top box. Moreover, a group of a number of electronic circuits and electronic components 7 is included in a bottom surface inside the housing. This electronic circuit and the electronic component group 7 is also one example, and is not requisite for the set-top box.

Figure 3:
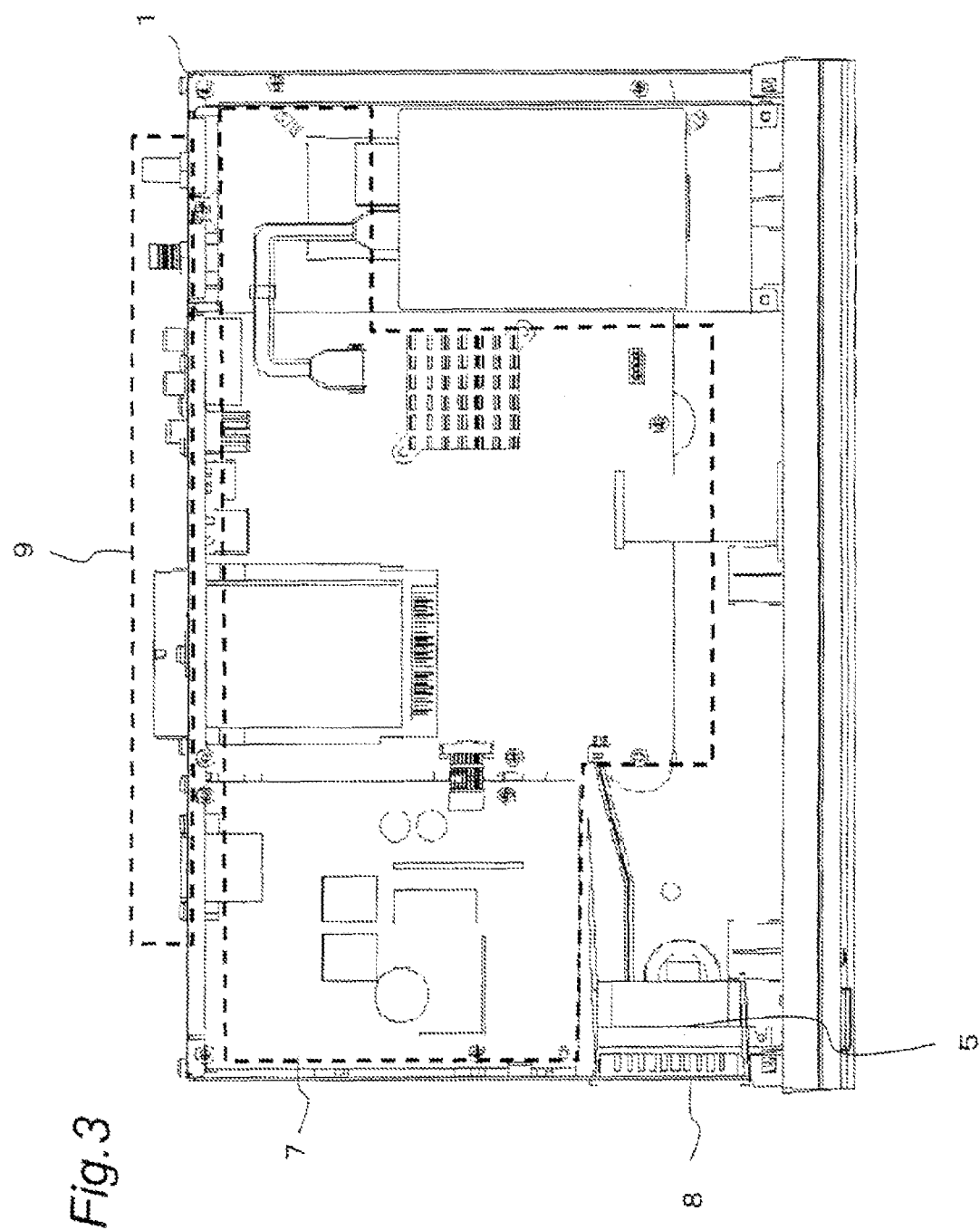
FIG. 3 is a top view of the set-top box, showing the internal structure of the set-top box according to the one embodiment of the present invention.

FIG. 3 is a top view of the set-top box 1, showing the internal structure of the set-top box according to the one embodiment of the present invention. The bottom surface of the set-top box 1 includes a third opening 8 in a distance from the left side surface inside the set-top box 1 to the cooling fan unit 5. The electronic circuit and the electronic component group 7 is not installed around the cooling fan unit 5. Also, an input/output terminal group 9 is provided in the housing back surface.

Figure 4:
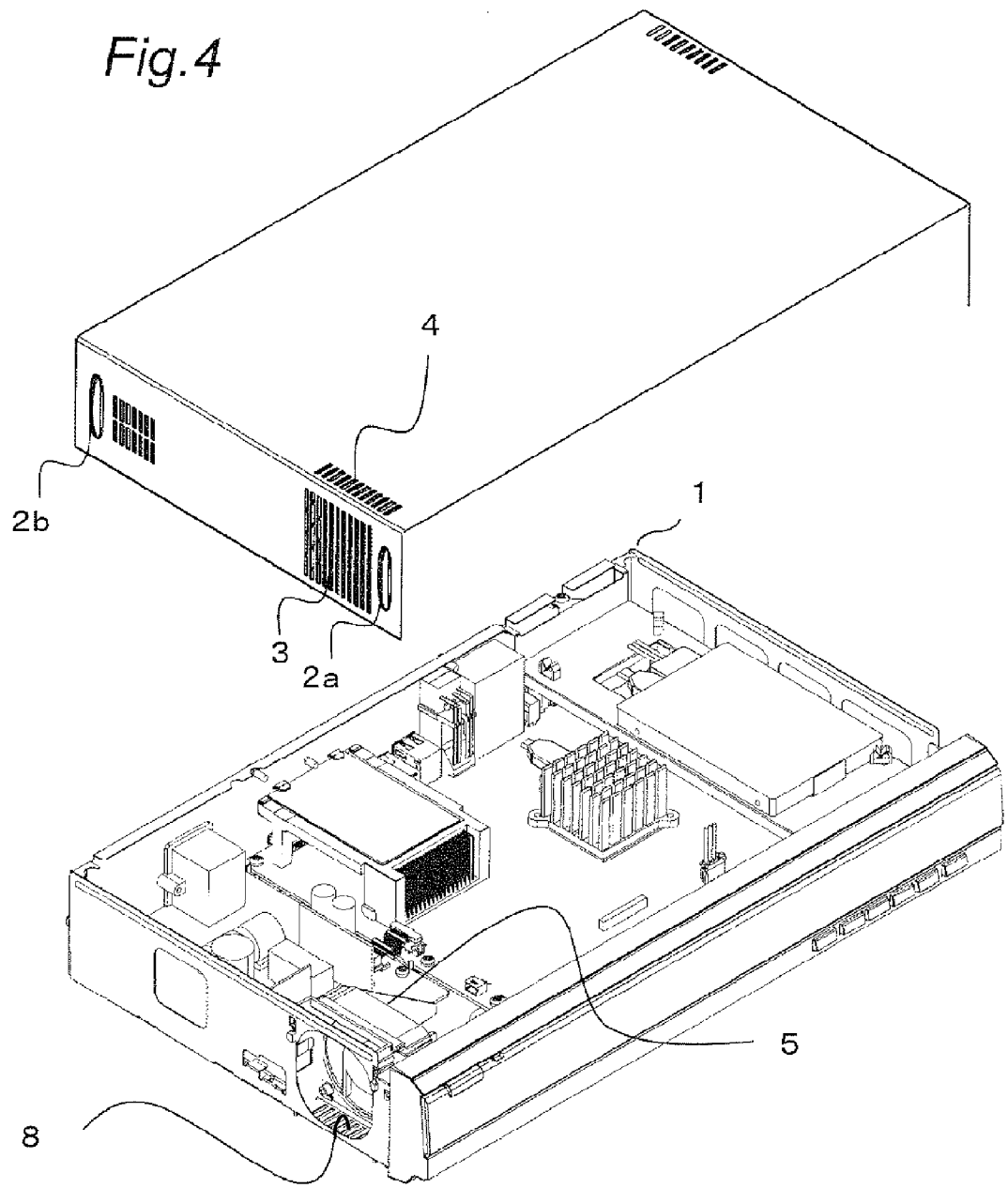
FIG. 4 is an exploded view from the left front side, showing correspondences between the internal structure and an external structure of the set-top box according to the one embodiment of the present invention.

FIG. 4 is an exploded view from the left front side, showing correspondences between the internal structure and an external structure of the set-top box according to the one embodiment of the present invention. In the housing left side surface of the set-top box 1, the first opening 3 is included in an area opposed to the cooling fan unit 5. Here, the cooling fan unit 5 functions as a duct connecting a ventilation path to the first opening 3, the second opening 4, and the third opening 8. This will be described in detail with reference to FIGS. 5A to 5F.

FIGS. 5A to 5F are hexahedral views of the cooling fan unit in the set-top box according to the one embodiment of the present invention. FIG. 5A is a front view of the cooling unit, FIG. 5B is a left side view of the cooling unit, FIG. 5C is a right side view of the cooling unit, FIG. 5D is a top view of the cooling unit, FIG. 5E is a bottom view of the cooling unit, and FIG. 5F is a back view of the cooling unit. The cooling fan unit 5 is made up of a cooling fan 10 and a fan holding portion, which is a site other than the cooling fan. The cooling fan 10 is made up of an exterior with four corners chamfered, and a fin radially spread. The cooling fan 10 is held at an outer circumference thereof by the fan holding portion and is integrated with the fan holding portion to make up the cooling fan unit 5. The cooling fan 10 is an exhaust fan to perform exhaust from a back surface side to a front surface side. The fan holding portion has a substantially square front surface and H-shaped top surface and bottom surface, and has a pentagonal cover in a left side surface. In the fan holding portion, side surface portions protruded from sites holding the outer circumference of the cooling fan 10 to a front surface side, and step portions protruded to an upper surface side and a bottom surface side make up a duct 11. The exhaust forms airflows toward predetermined directions with the duct 11 functioning as the ventilation path. This will be described in detail with reference to FIGS. 6A to 6H.

FIGS. 6A to 6H are octahedral views of the fan holding portion in the set-top box according to the one embodiment of the present invention. FIG. 6A is a front view, FIG. 6B is a left side view, FIG. 6C is a right side view, FIG. 6D is a top view, FIG. 6E is a bottom view, FIG. 6F is a back view, FIG. 6G is a perspective view from a right front side, and FIG. 6H is a perspective view from a left rear side. It is apparent from the perspective view from the right front side of FIG. 6G and the perspective view from the left rear side of FIG. 6H how the side surface portions protruded to the front surface side from the sites holding the outer circumference of the cooling fan 10, and the step portions protruded to the upper surface side and the bottom surface side make up the duct 11. The duct 11 is formed so as to vertically partition a space generated by arranging the cooling fan unit 5 so as to be parallel to, spaced at the predetermined distance from, and opposed to the left side surface inside the housing, and to abut on an inner wall of the housing left side surface to thereby confine the ventilation path in a front direction, in a top direction, and in a bottom direction. That is, the exhaust forms the airflows toward the front surface of the fan holding portion (the left side surface of the set-top box 1), the upper surface of the fan holding portion (the upper surface of the set-top box 1), and the bottom surface of the fan holding portion (the bottom surface of the set-top box 1) with the duct 11 used as the ventilation path. In destinations of the airflows, the first opening 3, the second opening 4, and the third opening 8 are formed, respectively, so that the exhaust is performed from the set-top box 1.

FIGS. 7A to 7D are tetrahedral views of the set-top box according to the one embodiment of the present invention. FIG. 7A is a top view, FIG. 7B is a left side view, FIG. 7C is a right side view, and FIG. 7D is a front view. The set-top box 1 may include an opening for suction or heat release in addition to the first opening 3, the second opening 4, and the third opening 8.

<Operation of Electronic Device>

Referring to FIGS. 3 to 5, operation of the electronic device will be described.

The set-top box 1 performs communication of an electric signal through the input/output terminal group 9. At this time, the hard disk drive 6 and the electronic circuit and electronic component group 7 inside the housing come to have a high temperature. In order to cool the housing inside having the high temperature, the cooling fan 10 operates to perform the exhaust from the first opening 3, the second opening 4, and the third opening 8.

<Operation in Installing with Side Surface at Bottom>

Referring to FIGS. 8A to 8C, operation in installing the set-top box 1 with the left side surface at the bottom will be described.

FIGS. 8A to 8C are each an enlarged view of the vicinity of an installation surface in installing the set-top box according to the one embodiment of the present invention with the left side surface at the bottom, that is, an enlarged view of the vicinity of the installation surface in installing the set-top box with the side surface having the first opening 3 at the bottom. FIG. 8A is a partially enlarged view of the set-top box when viewed from the upper surface side, FIG. 8B is a partially enlarged view when viewed from the front surface side, and FIG. 8C is a partial view of a lower half of the set-top box when viewed from the upper surface side. As shown in FIG. 8C, when the set-top box is installed on an installation surface 12 with the left side surface at the bottom, the set-top box comes into contact with the installation surface 12 at two positions of apexes 13a, 13b of the projected portions 2a, 2b provided on the left side surface. At this time, since the apexes 13a, 13b of the projected portions 2a, 2b are located in a line, the set-top box 1 cannot stand upright with the left side surface at the bottom, and loses a balance, thereby leaning on the upper surface side or on the bottom surface side. This allows a user of the set-top box 1 to give up installing the set-top box 1 with the left side surface at the bottom. In this manner, providing the projected portions 2a, 2b on the left side surface prevents the first opening 3 provided in the same left side surface from being blocked.

Next, with reference to FIGS. 9A and 9B, a principle of preventing the set-top box 1 from standing on its own with the left side surface of the housing at the bottom will be described.

Figure 9A:
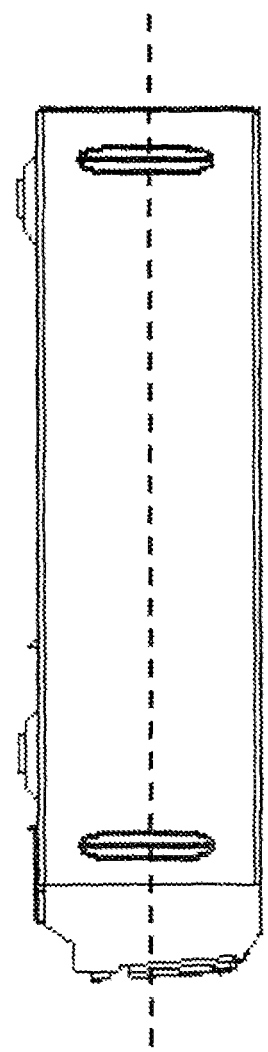
FIG. 9A is a plan view of one example in which two projected portions are provided in a side surface of the set-top box.
Figure 9B:
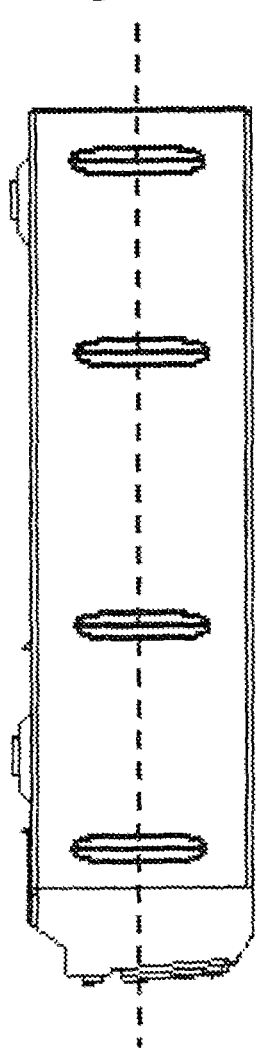
FIG. 9B is a plan view of one example in which four projected portions are provided so as to be arranged in a line in the side surface of the set-top box.

FIGS. 9A and 9B are schematic views of various side surfaces of the set-top box. FIG. 9A is a schematic view of the left side view of the set-top box according to the one embodiment of the present invention. FIG. 9B is a schematic view of the left side view of the set-top box according to a modification of the one embodiment of the present invention. In each of the configurations, only the configuration corresponding to the housing side surface and the projected portions is illustrated for simplification of the drawing. Each of dashed lines is a line connecting the apexes of the projected portions. In the set-top box according to the present embodiment, as shown in FIG. 9A, the apexes of the projected portions are located in a line. As shown in FIG. 9B, even when the left side surface further includes a plurality of projected portions and a plurality of apexes exist, the set-top box does not stand upright if a line connecting the apexes when the apexes are connected by the line is in alignment. Here, for example, if the left side surface includes the plurality of projected portions, and the plurality of apexes exist, and the line connecting the apexes when the apexes of the projected portions are connected by the line is not in alignment, there is a possibility that the set-top box stands upright with the respective apexes of the projected portions used as legs.

Moreover, in FIGS. 8A to 8C, when the projected portions 2 come into contact with the installation surface 12 not at points but in surfaces, similarly, there is a possibility that the set-top box 1 stands upright with the left side surface of the housing as the bottom surface and the surfaces of the projected portions 2 in contact with the installation surface used as the legs. Furthermore, for example, when the installation surface 12 is made of a cushion-like soft material, there is a possibility that the projected portions 2 sink down on the installation surface 12, so that the apexes 13 of the projected portions 2 come into contact with the installation surface 12 not at the points but in the surfaces, and the set-top box 1 stands upright with the left side surface at the bottom, thereby blocking the first opening 3. However, in such a case, as described above, when the second opening 4 and the third opening 8 are provided in the upper surface and the bottom surface in advance, the exhaust is performed from the provided second opening 4 and third opening 8, which enables the cooling inside the housing to be continued.

In order to more strongly prevent the first opening 3 from being blocked, the plurality of projected portions 2 may be arranged in the left side surface of the housing, so that a surface in contact with an arbitrary side of the left side surface of the housing and all the plurality of projected portions 2 does not exist. Alternatively, even when the surface in contact with the arbitrary side of the left side surface of the housing and the projected portions 2 exists, the configuration may be such that a gravity center of the set-top box 1 does not exist in a vertical direction from an area of the surface connecting contact points to the projected portions 2 from the arbitrary side of the left side surface. This will be described in detail with reference to FIGS. 10A and 10B.

FIGS. 10A and 10B are schematic views showing motions when the various set-top boxes are placed with the side surfaces thereof at the bottom. FIG. 10A is a plan view showing arrangement of the projected portions in one of the side surfaces of the set-top box where the surface in contact with the arbitrary side of the left side surface and all the projected portions does not exist. FIG. 10B is a plan view showing arrangement of the projected portions of one of the side surfaces of the set-top box where the surface in contact with the arbitrary side of the left surface and the projected portions exist, and the gravity center does not exist in the vertical direction from the area of the surface connecting the contact points to the projected portions from the arbitrary side of the left side surface. A shaded small circle schematically indicates the gravity center of the set-top box, and dashed lines indicate the area vertically above the surface connecting the contact points.

If the surface in contact with the arbitrary side of the left side surface and the projected portions exists, the set-top box may come into contact with the installation surface at the apexes of the projected portions and the one side of the side surface. Furthermore, since the gravity center constantly tends to exist in a lower direction, when the gravity center exists vertically above the area formed by lines connecting the apexes of the projected portions and the one side of the side surface in contact with the installation surface, the set-top box stands on its own, and thus, this arrangement needs to be avoided.

As shown in FIG. 10A, if the flat surface in contact with the arbitrary side of the left side surface and all the plurality of projected portions does not exist, that is, if the projected portions of the set-top box come into contact with the installation surface only at points, in order to cause the set-top box to stand on its own, the gravity center needs to exist at pinpoints vertically above the projected portions, which are the contact points with the installation surface. As a result, it is remarkably difficult to cause the set-top box to stand on its own.

Moreover, as shown in FIG. 10B, even when the surface in contact with the arbitrary side of the left side surface and the projected portions 2 exists, the set-top box does not stand on its own, unless the gravity center exists in the area vertically above the surface connecting the contact points (the apexes of the projected portions and the side on the bottom surface side in the left side surface). In this case, in detail, a rotation moment acts so that the surface of the set-top box opposed to the installation surface moves away from the installation surface, which can guide the set-top box to fall without standing on its own. In the present invention, in order to prevent the first opening 3 from being blocked, it is desirable that the set-top box 1 does not stand on its own with the left side surface at the bottom. This is because there is a possibility that even though the set-top box 1 does not stand on its own with the left side surface at the bottom, the exhaust of the first opening 3 is not performed as designed, if the set-top box 1 stands on its own in an inclined manner. Thus, by shaping the projected portions 2 as shown in FIG. 10A, by installing a heavy component such as the hard disk drive 6 on the right surface side of the set-top box 1 as shown in FIG. 10B, and so on to adjust a gravity center position of the entire electronic device, the rotation moment acts so that the surface opposed to the installation surface moves away from the installation surface. This makes the set-top box 1 fall on the upper surface side or on the bottom surface side, which can surely prevent the set-top box 1 from standing on its own.

The number of the projected portions 2 is preferably two. If the left side surface of the housing includes too many projected portions, it is difficult to form the first opening 3 in the left side surface. Moreover, if the housing left surface includes too many projected portions, a shape of the left side surface becomes closer to a substantially curved surface, and thus, in this case, it is difficult to arrange the cooling fan unit 5 so as to be parallel to, spaced at the predetermined distance from, and opposed to the housing left side surface. When the number of the projected portions is one, the set-top box 1 can be surely prevented from standing on its own, however, there is a high possibility that the set-top box 1 stands on its own in an inclined manner.

Similarly, as to the projected portions 2, it is preferable to arrange the plurality of projected portions 2 having the substantially same shape, as in the present embodiment. This makes it easy in design to specify positions where the apexes 13 are formed, thereby making it easy to determine whether or not the line connecting the apexes 13 is formed straight.

Moreover, as in the present embodiment, when a surface from the apex 13 of the projected portion 2 to the left side surface is formed into a curved surface, the installation surface is not damaged, and the housing falls slowly, which increases applicability of the set-top box 1. As a shape of the curved surface of the projected portion 2, a two-dimensional curved, arch shape is desirable as in the present embodiment. Thereby, the apex 13 of the projected portion 2 to come into contact with the installation surface is settled at one point, which can prevent the unintended apex 13 of the projected portion 2 from coming into contact with the installation surface.

When the set-top box 1 is installed with the left side surface of the housing at the bottom, the design may be such that the apexes of the projected portions 2 are located on the upper surface side with respect to a gravity center axis vertically passing the gravity center of the set-top box. This will be described in detail with reference to FIG. 11.

Figure 11:
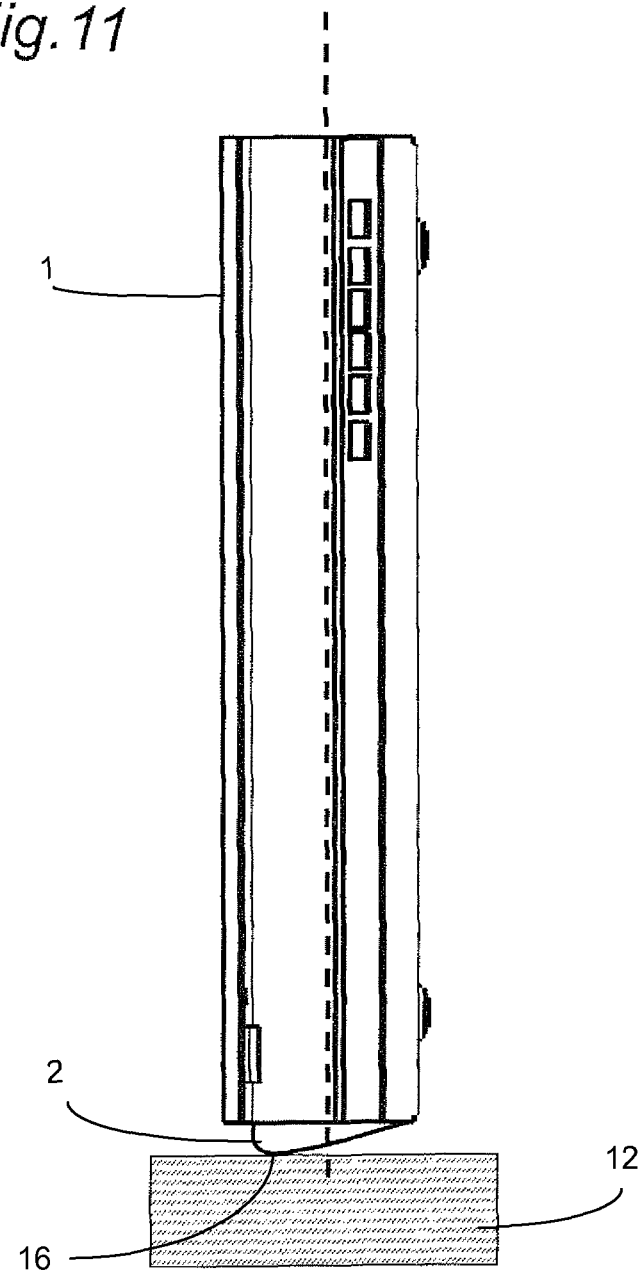
FIG. 11 is a front view when the set-top box according to a modification of the one embodiment of the present invention is placed with a left side surface at the bottom.

FIG. 11 is a front view when the set-top box according to a modification of the one embodiment of the present invention is placed with the left side surface at the bottom. A dashed line indicates the gravity center axis in a vertical direction of the housing of the set-top box. In this modification, the apexes of the projected portions are located on the upper surface side with respect to the gravity center axis in the vertical direction of the housing of the set-top box. This can guide the set-top box 1 to fall with the bottom surface, which is thought to have been designed to be strong to impact, at the bottom, even when the user removes his or her hand from the set-top box 1 in the case where the set-top box 1 does not stand on its own. This enables the set-top box 1 to stand on its own with the bottom surface of the housing, which surface has been originally designed so as to be the bottom surface, at the bottom without damaging the set-top box 1, even when the user forcibly causes the set-top box 1 to stand on its own with the left side surface at the bottom.

Moreover, in the formation of the projected portions 2, integrally forming the left side surface of the set-top box 1 and the projected portions 2 brings about an excellent cost reduction effect in cost on manufacturing.

While in the present embodiment, the cooling fan unit 5 is arranged so as to be parallel to, spaced at the predetermined distance from, and opposed to the left side surface of the housing, the present invention is not limited to the above-described arrangement condition, but the cooling fan unit 5 may be arranged substantially in contact with the left side surface of the housing without the predetermined distance from the side surface of the housing. In this case, since the predetermined distance does not exist between the side surface of the housing and the cooling fan unit 5, the second opening 4, the third opening 8, and the duct 11 cannot be included in the set-top box 1. However, since the projected portions 2 prevent the first opening 3 from being blocked, the cooling inside the housing is continued.

In contrast to the above, even in the case where the projected portions 2 are not included in the side surface of the housing of the set-top box 1, when in the set-top box 1, the cooling fan unit 5 is arranged to be parallel to, spaced at the predetermined distance from, and opposed to the housing left side surface, the second opening 4 and the third opening 8 are provided, and the duct 11 connecting the ventilation path between the cooling fan 10, and the first opening 3, the second opening 4, and the third opening 8 exists, the cooling inside the housing is continued even if the set-top box 1 is placed with the first opening 3 at the bottom, thereby blocking the first opening 3.

Moreover, since the second opening 4 is open in the upper surface, there is a possibility that foreign substances come in. Thus, when the second opening 4 is provided in the housing, the electronic circuit and electronic component group 7 may not be installed around the cooling fan unit as in the present embodiment.

The cooling fan in the electronic-device housing of the present invention may be a suction fan or may be an exhaust fan as in the present embodiment. However, in the case of the suction fan, since the suction may be performed from a slight clearance of the electronic-device housing, even if a ventilation port is blocked, and thus, the present invention is particularly preferable for the case where the cooling fan is the exhaust fan.

Since the electronic-device housing of the present invention is excellent in heat release performance, for example, it is useful as an electronic-device housing on which a component having a tendency of temperature rise, such as a hard disk drive, is mounted.

DESCRIPTION OF REFERENCE SIGNS 1 set-top box
2, 2a, 2b projected portion
3 first opening
4 second opening
5 cooling fan unit
6 hard disk drive
7 electronic circuit and electronic component group
8 third opening
9 input/output terminal group
10 cooling fan
11 duct
12 installation surface
13, 13a, 13b apex
14 first surface
15 end portion
16 a surface
17 virtual solid
20 center of gravity

The invention claimed is:

1. An electronic-device housing comprising:
   a first surface having at least one opening to release heat outside, and at least one projected portion that projects away from the electronic-device housing,
   wherein when the electronic-device housing is installed on an installation surface so that the first surface is opposed to the installation surface, and the projected portion comes into contact with the installation surface, a curved surface of the projected portion allows a force to act on a gravity center of the electronic-device housing so that the electronic-device housing rotates and the first surface moves away from the installation surface, and
   wherein when the electronic-device housing is installed on the installation surface so that the first surface is opposed to the installation surface, and the projected portion comes into contact with the installation surface, the gravity center of the electronic-device housing exists outside a virtual solid formed vertically above a surface formed by connecting the projected portion in contact with the installation surface, and each end portion of the first surface in contact with the installation surface.

2. An electronic-device housing that is able to store therein an electronic circuit and a cooling fan, the electronic-device housing comprising:
   a first surface having at least one opening to release heat outside, and at least one projected portion that projects away from the electronic-device housing,
   wherein when the electronic-device housing is installed on an installation surface so that the first surface is opposed to the installation surface, and the projected portion comes into contact with the installation surface, a curved surface of the projected portion allows a force to act on the gravity center of the electronic-device housing so that the electronic-device housing rotates and the first surface moves away from the installation surface,
   the electronic-device housing has a rectangular parallelepiped shape having a pair of side surfaces, a bottom surface, an upper surface, a front surface, and a back surface,
   the first surface corresponds to one side surface of the pair of side surfaces, and
   at least one length of a height of the electronic-device housing corresponding to a length between the upper surface and the bottom surface, and a depth of the electronic-device housing corresponding to a length between the front surface and the back surface is not more than a width of the electronic-device housing corresponding to a length between the pair of side surfaces, and wherein the cooling fan is arranged so as to be opposed to the one side surface inside the electronic-device housing, the one side surface has a first opening for ventilation in an area opposed to the cooling fan, and when the electronic-device housing is installed with the one side surface at a bottom, an apex of the projected portion comes into contact with the installation surface at a point.

3. The electronic-device housing according to claim 1, wherein the projected portion includes a plurality of projected portions, and the plurality of projected portions are arranged in a line.

4. An electronic-device housing comprising:
a first surface having at least one opening to release heat outside, and at least one projected portion that projects away from the electronic-device housing,
wherein when the electronic-device housing is installed on an installation surface so that the first surface is opposed to the installation surface, and the projected portion comes into contact with the installation surface, a curved surface of the projected portion allows a force to act on a gravity center of the electronic-device housing so that the electronic-device housing rotates and the first surface moves away from the installation surface,
wherein the electronic-device housing with the projected portion cannot stand on its own when the electronic-device housing is installed with the first surface as a bottom.

5. The electronic-device housing according to claim 2, wherein when the electronic-device housing is installed with one side surface at the bottom, a gravity center axis is presumed as vertically passing the gravity center of the electronic-device housing, an apex of the projected portion exists at an upper surface side with respect to the gravity center axis.

6. The electronic-device housing according to claim 2, wherein the upper surface of the electronic-device housing includes a second opening for ventilation, and
wherein the cooling fan is arranged inside the electronic-device housing so as to be parallel to, spaced at a predetermined distance from, and opposed to the one side surface of the electronic-device housing, and
the second opening is provided in the predetermined distance from the one side surface of the electronic-device housing.

7. An electronic device comprising:
the electronic-device housing according to claim 1;
an electronic circuit stored inside the electronic-device housing; and
a cooling fan stored inside the electronic-device housing.

* * * * *